(12) United States Patent
Ellä

(10) Patent No.: US 6,388,544 B1
(45) Date of Patent: May 14, 2002

(54) METHOD FOR ADJUSTING THE CENTER FREQUENCY OF A BALANCED FILTER AND A PLURALITY OF BALANCED FILTERS

(75) Inventor: Juha Ellä, Halikko (FI)

(73) Assignee: Nokia Mobile Phones Ltd., Espoo (FI)

( * ) Notice: Subject to any disclaimer, the term of this patent is extended or adjusted under 35 U.S.C. 154(b) by 0 days.

(21) Appl. No.: 09/718,919

(22) Filed: Nov. 22, 2000

(30) Foreign Application Priority Data

Nov. 29, 1999 (FI) .............................. 19992547

(51) Int. Cl.$^7$ .............................. H03H 9/54; H01P 1/20
(52) U.S. Cl. ...................... 333/189; 333/190; 333/191; 333/202; 333/188
(58) Field of Search ................ 333/186–192, 333/202

(56) References Cited

U.S. PATENT DOCUMENTS

| | | | | |
|---|---|---|---|---|
| 5,373,268 A | | 12/1994 | Dworsky et al. ........... | 333/187 |
| 5,760,663 A | | 6/1998 | Pradal ........................ | 333/187 |
| 5,825,263 A | * | 10/1998 | Falt ............................ | 333/204 |
| 5,910,756 A | * | 6/1999 | Ella ............................ | 333/133 |
| 6,278,342 B1 | * | 8/2001 | Ellä ........................... | 333/189 |

FOREIGN PATENT DOCUMENTS

| | | |
|---|---|---|
| EP | 0834989 A3 | 4/1998 |
| EP | 0865157 A3 | 9/1998 |
| EP | 0949756 A2 | 10/1999 |
| EP | 1 017 170 A2 | 7/2000 |

OTHER PUBLICATIONS

"An Air–Gap Type Piezoelectric Composite Thin film Resonator". Satoh et al., 15 Proc. 39$^{th}$ Annual Symp. Freq. Control, pp. 361–366, 1985.

"Acoustic Bulk Wave Composite Resonators", Larkin et al., Applied Physics Letters, vol. 38, No. 3, pp. 125–127, Feb. 1981.

* cited by examiner

*Primary Examiner*—Benny Lee
*Assistant Examiner*—Barbara Summons
(74) *Attorney, Agent, or Firm*—Perman & Green, LLP

(57) ABSTRACT

Method (800) for adjusting the center frequency of a balanced filter comprising at least four resonators, comprises the following steps: specifying (801) a nominal center frequency for the balanced filter when connected to a circuitry having a certain nominal impedance; determining (802) the actual center frequency of the balanced filter when connected to a circuitry having a certain actual impedance, comparing (803, 804) the actual center frequency of the filter to the nominal one, and adjusting (805, 806) the impedance ratio between the circuitry and the balanced filter within certain limits based on the comparison. A plurality of balanced filters (1610, 1620, 1630) on a substrate (1600) is characterized in that the total area of bulk acoustic wave resonators in the balanced resonators depends on the position of the balanced filter on the substrate. Further, the balanced filters have substantially the same actual center frequency.

17 Claims, 10 Drawing Sheets

METHOD FOR ADJUSTING THE CENTER FREQUENCY OF A BALANCED FILTER AND A PLURALITY OF BALANCED FILTERS

The invention relates in general to resonator structures of radio communication apparatus, especially bulk acoustic wave filter structures. In particular, the invention is directed to balanced radio frequency filter structures.

The development of mobile telecommunications continues towards ever smaller and increasingly complicated handheld units. The development leads to increasing requirements on the miniaturization of the components and structures used in the mobile communication means. This development concerns radio frequency (RF) filter structures as well, which despite the increasing miniaturization should be able to withstand considerable power levels, have very steep passband edges, and low losses.

The RF filters used in prior art mobile phones are usually discrete surface acoustic wave (SAW) or ceramic filters. Surface acoustic wave (SAW) resonators typically have a structure similar to that shown in FIG. 1. Surface acoustic resonators utilize surface acoustic vibration modes of a solid surface, in which modes the vibration is confined to the surface of the solid, decaying quickly away from the surface. A SAW resonator typically comprises a piezoelectric layer 100, and two electrodes 122, 124. Various resonator structures such as filters are produced with SAW resonators. A SAW resonator has the advantage of having a very small size, but unfortunately cannot withstand high power levels.

It is known to construct thin film bulk acoustic wave resonators on semiconductor wafers, such as silicon (Si) or gallium arsenide (GaAs) wafers. For example, in an article entitled "Acoustic Bulk Wave Composite Resonators", Applied Physics Letters, Vol. 38, No. 3, pp. 125–127, Feb. 1, 1981, by K. M. Lakin and J. S. Wang, an acoustic bulk wave resonator is disclosed which comprises a thin film piezoelectric layers of zinc oxide (ZnO) sputtered over a thin membrane of silicon (Si). Further, in an article entitled "An Air-Gap Type Piezoelectric Composite Thin Film Resonator", I5 Proc. 39th Annual Symp. Freq. Control, pp. 361–366, 1985, by Hiroaki Satoh, Yasuo Ebata, Hitoshi Suzuki, and Choji Narahara, a bulk acoustic wave resonator having a bridge structure is disclosed.

Figure 2:
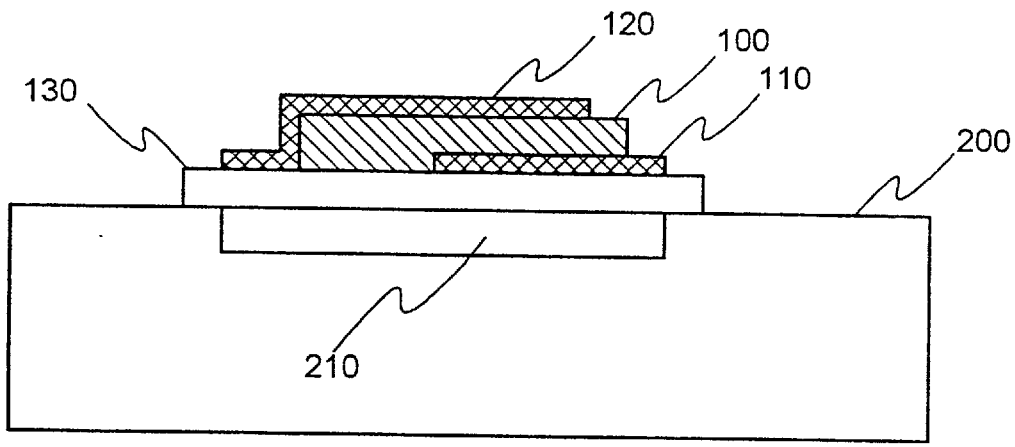

FIG. 2 shows one example of a bulk acoustic wave resonator having a bridge structure. The structure comprises a membrane 130 deposited on a substrate 200. The resonator further comprises a bottom electrode 110 on the membrane, a piezoelectric layer 100, and a top electrode 120. A gap 210 is created between the membrane and the substrate by etching away some of the substrate from the top side. The gap serves as an acoustic isolator, essentially isolating the vibrating resonator structure from the substrate.

Bulk acoustic wave resonators are not yet in widespread use, partly due to the reason that feasible ways of combining such resonators with other circuitry have not been presented. However, BAW resonators have some advantages as compared to SAW resonators. For example, BAW structures have a better tolerance of high power levels.

In the following, certain types of BAW resonators are described first.

Bulk acoustic wave resonators are typically fabricated on silicon (Si), gallium arsenide (GaAs), glass, or ceramic substrates. One further ceramic substrate type used is alumina. The BAW devices are typically manufactured using various thin film manufacturing techniques, such as for example sputtering, vacuum evaporation or chemical vapor deposition. BAW devices utilize a piezoelectric thin film layer for generating the acoustic bulk waves. The resonance frequencies of typical BAW devices range from 0.5 GHz to 5 GHz, depending on the size and materials of the device. BAW resonators exhibit the typical series and parallel resonances of crystal resonators. The resonance frequencies are determined mainly by the material of the resonator and the dimensions of the layers of the resonator.

A typical BAW resonator consists of three basic elements:
 an acoustically active piezoelectric layer,
 electrodes on opposite sides of the piezoelectric layer, and
 acoustical isolation from the substrate.

The piezoelectric layer may be for example, ZnO, AlN, ZnS or any other piezoelectric material that can be fabricated as a thin film. As a further example, also ferroelectric ceramics can be used as the piezoelectric material. For example, $PbTiO_3$ and $Pb(Zr_xTi_{1-x})O_3$ and other members of the so called lead lanthanum zirconate titanate family can be used.

Preferably, the material used to form the electrode layers is an electrically conductive material having a high acoustic impedance. The electrodes may be comprised of for example any suitable metal, such as tungsten (W), aluminum (Al), copper (Cu), molybdenum (Mo), nickel (Ni), titanium (Ti), niobium (Nb), silver (Ag), gold (Au), and tantalum (Ta). The substrate is typicall composed of for example Si, $SiO_2$, GaAs, glass, or ceramic materials.

The acoustical isolation can be produced with for example the following techniques:
 with a substrate via-hole,
 with a micromechanical bridge structure, or
 with an acoustic mirror structure.

In the via-hole and bridge structures, the acoustically reflecting surfaces are the air interfaces below and above the devices. The bridge structure is typically manufactured using a sacrificial layer, which is etched away to produce a free-standing structure. Use of a sacrificial layer makes it possible to use a wide variety of substrate materials, since the substrate does not need to be modified very much, as in the via-hole structure. A bridge structure can also be produced using an etch pit structure, in which case a pit has to be etched in the substrate or the material layer below the BAW resonator in order to produce the free standing bridge structure.

Figure 3:
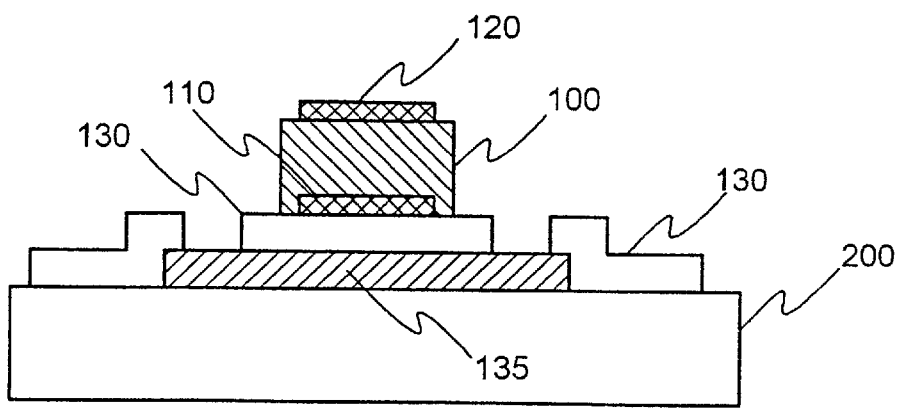

FIG. 3 illustrates one example of various ways of producing a bridge structure. Before the deposition of other layers of the BAW structure, a sacrificial layer 135 is deposited and patterned first. The rest of the BAW structure is deposited and patterned partly on top of the sacrificial layer 135. After the rest of the BAW structure is completed, the sacrificial layer 135 is etched away. FIG. 3 shows also the substrate 200, a membrane layer 130, the bottom electrode 110, the piezoelectric layer 100, and the top electrode 120. The sacrificial layer can be realized using for example a metal or a polymer as the material.

Figure 4:
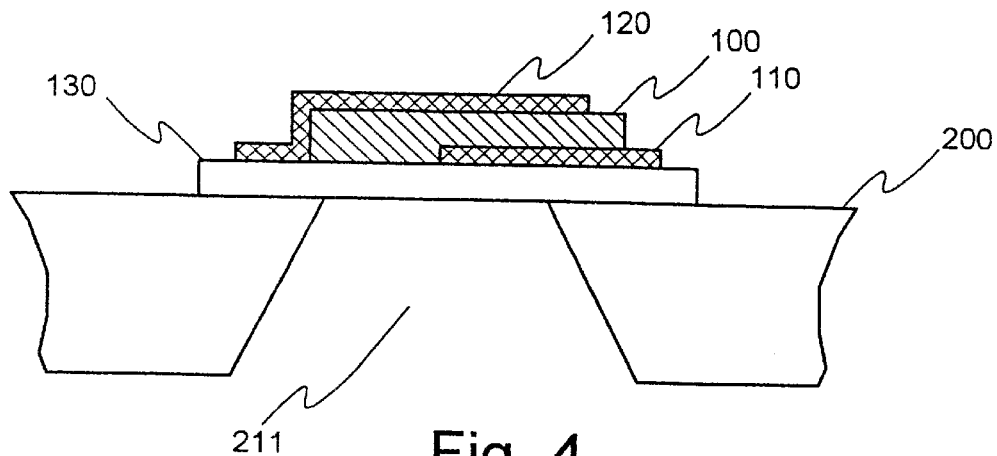

In the via-hole structure, the resonator is acoustically isolated from the substrate by etching away the substrate from under a major portion of the BAW resonator structure. FIG. 4 illustrates a via-hole structure of a BAW resonator. FIG. 4 shows the substrate 200, a membrane layer 130, the bottom electrode 110, the piezoelectric layer 100, and the top electrode 120. A via-hole 211 has been etched through the whole substrate. Due to the etching required, via-hole structures are commonly realized only with Si or GaAs substrates.

A further way to isolate a BAW resonator from the substrate is by using an acoustical mirror structure. The acoustical mirror structure performs the isolation by reflecting the acoustic wave back to the resonator structure. An acoustical mirror typically comprise several layers having a thickness of one quarter wavelength at the center frequency, alternating layers having differing acoustical impedances. The number of layers in an acoustic mirror is typically an odd integer, typically ranging from three to nine. The ratio of acoustic impedance of two consecutive layers should be large in order to present as low acoustic impedance as possible to the BAW resonator, instead of the relatively high impedance of the substrate material. In the case of a piezoelectric layer that is one quarter of the wavelength thick, the mirror layers are chosen so that as high acoustic impedance as possible is presented to the resonator. This is disclosed in U.S. Pat. No. 5,373,268. The material of the high impedance layers can be for example gold (Au), molybdenum (Mo), or tungsten (W), and the material of the low impedance layers can be for example silicon (Si), polysilicon (poly-Si), silicon dioxide ($SiO_2$), aluminum (Al), or a polymer. Since in structures utilizing an acoustical mirror structure, the resonator is isolated from the substrate and the substrate is not modified very much, a wide variety of materials can be used as a substrate. The polymer layer may be comprised of any polymer material having a low loss characteristic and a low acoustic impedance. Preferably, the polymer material is such that it can withstand temperatures of at least 350° C., since relatively high temperatures may be achieved during deposition of other layers of the acoustical mirror structure and other structures. The polymer layer may be comprised of, by example, polyimide, cyclotene, a carbon-based material, a silicon-based material or any other suitable material.

Figure 5:
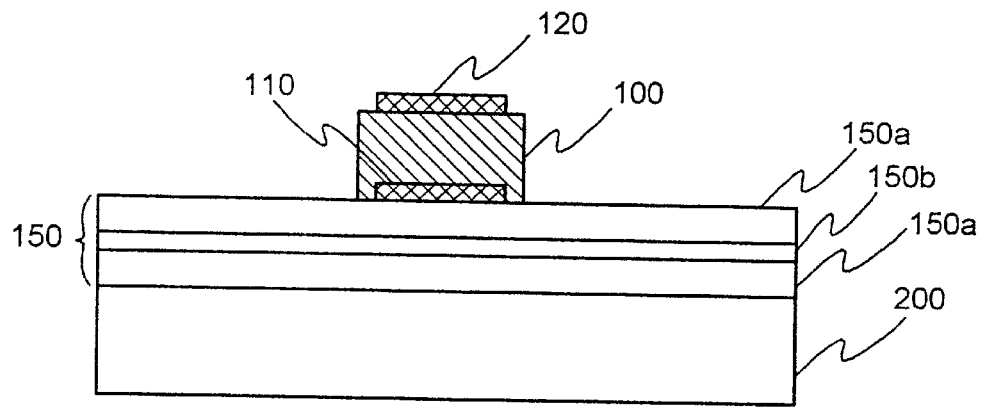

FIG. 5 shows an example of a BAW resonator on top of an acoustical mirror structure. FIG. 5 shows the substrate 200, the bottom electrode 110, the piezoelectric layer 100, and the top electrode 120. The acoustical mirror structure 150 comprises in this example three layers 150a, 150b. Two of the layers 150a are formed of a first material, and the third layer 150b in between the two layers is formed from a second material. The first and second materials have different acoustical impedances as described previously. The order of the materials can be varied. For example, the material with a high acoustical impedance can be in the middle and the material with a low acoustical impedance on both sides of the middle material, or vice versa. The bottom electrode may also be used as one layer of the acoustical mirror.

Figure 6:
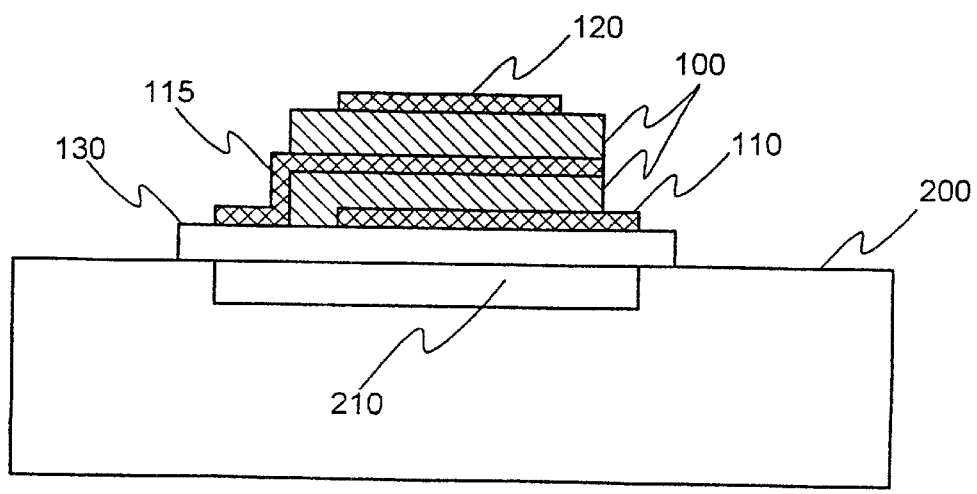

FIG. 6 shows a further example of a BAW resonator structure. The BAW resonator illustrated in FIG. 6 is a stacked resonator structure having two piezoelectric layers 100. In addition to the bottom 110 and top 120 electrodes, a stacked structure requires a middle electrode 115, which is connected to ground potential.

FIG. 6 further shows the membrane layer 130, the substrate 200 and the etch pit 210 isolating the structure from the substrate.

Figure 7A:
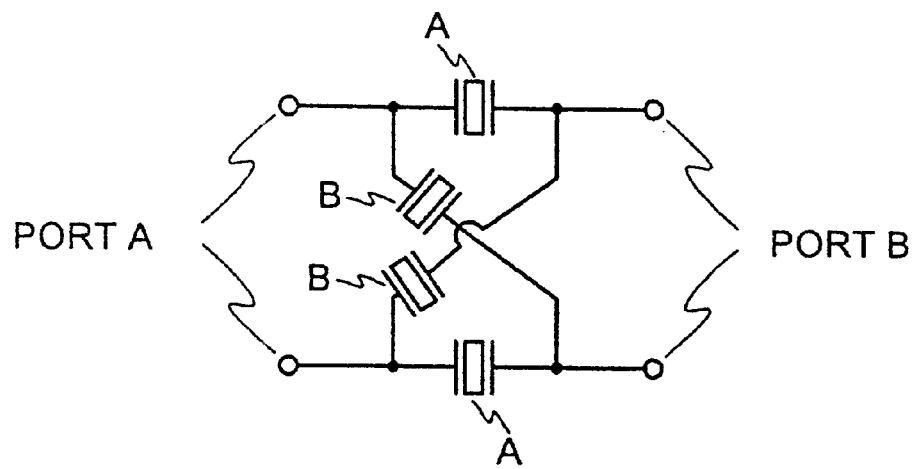
Figure 7B:
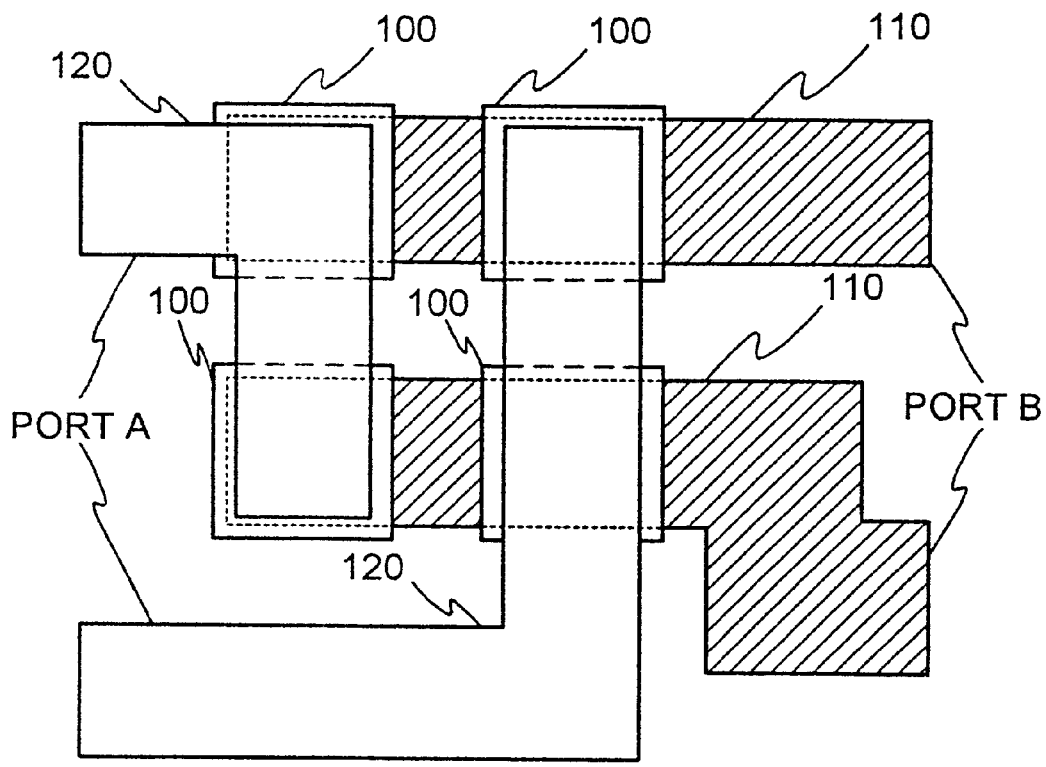

FIG. 7a shows a schematic diagram of a lattice filter structure constructed using bulk acoustic wave resonators. A lattice filter consisting of BAW resonators is usually designed so that two of the four resonators i.e. resonators A have higher resonance frequencies than the resonators B. Typically the series resonance of resonators A is at or close to the parallel resonance frequency of the resonators B, which is the center frequency of the filter. The difference in the resonance frequencies can be achieved for example in the same way as typically done in BAW filters having a ladder structure, namely by increasing the thickness of one of the layers of the B resonators or depositing an additional layer on top of the B resonators. The additional layer, sometimes called the tuning layer, can be either a metal or a dielectric layer. An example of the layout of such a lattice structure is shown in FIG. 7b. Typically, the size of the resonators is determined by the desired impedance level of the filter. The impedance level is determined mainly by the inherent shunt capacitance $C_0$ of the resonators, i.e. the capacitance between the top and bottom electrodes.

As explained in Finnish patent application FI982824, two of the four resonators of the lattice structure may have a larger area than the other two. The resonators having a large area can be either the resonators marked with B in FIG. 7a or the resonators marked with A in FIG. 7a. When the ratio of the areas is suitably chosen, the frequency response of such a balanced filter has a very steep attenuation slope outside the passband. This is in many applications a very desirable property of a band pass filter.

In this specification and especially in the accompanied claims, the term area of a resonator refers to the cross sectional area of the resonator, the cross section being taken in a plane substantially parallel to the substrate surface and the area being covered by both the top and the bottom electrodes. Although in the example of FIG. 7a the piezoelectric layers of the four resonators are separate, the piezoelectric layers of the resonators may form a single continuous layer. In this case the area of the resonator is defined substantially by the overlapping area of the top and the bottom electrodes at the location, where the overlapping occurs.

Balanced filters are typically band pass filters. The frequency response of a balanced filter is substantially symmetric around a certain frequency which is called the center frequency. Balanced filters are typically designed so that their impedance level at the center frequency gives optimal matching to the surrounding circuitry or, in other words, to the terminating impedances. Generally the resonators marked with A and B in. FIG. 7a have equal impedance levels, but it is also possible to design the balanced filter structure so that the geometric mean of the impedances of the resonators A and B is equal to the terminating impedances.

In general it is very important that a balanced filter has a certain specified frequency response and a certain specified impedance. The frequency response defines, for example, the radio frequencies where the filter can be used. The impedance level is typically determined by the surrounding circuitry, and it is usually 50 Ω. If the impedance of the filter and the surrounding circuitry do not match, the frequency response of the filter may change drastically. Typically in the passband frequencies the filter may attenuate too much and the frequency response may not retain its shape.

The difficulty in producing balanced filters employing BAW resonators is that when the piezoelectric layer of the BAW filters is sputter deposited on a substrate wafer, the thickness of the piezoelectric layer is not uniform throughout the wafer. The resonance frequencies of a BAW resonator are determined mainly by the acoustical properties of the piezoelectric material and the thickness of the piezoelectric layer. The resonance frequencies increase as the thickness of the piezoelectric layer decreases. The frequency response and the center frequency of a balanced filter depend on the resonance frequencies of the resonators in the filter structure. Consequently, on a wafer only a small portion of the manufactured balanced filters may thus exhibit the desired center frequency and frequency response. For example, the non-uniformity of the piezoelectric layer may cause about 8 MHz change in the center frequency of the balanced filters, when the center frequencies are of the order of 1 GHz. 8 MHz shift in the center frequency may be too much in some applications.

This variation in the center frequency causes that when manufacturing balanced filters employing BAW resonators the yield can be very low. It is possible to deposit additional layers to or remove some material from some of the resonators on a wafer. The layer structure of the BAW resonators at some parts of the wafer may be modified this way, but it is very tedious and involves extra processing steps.

This problem of a manufactured balanced filter not having a desired frequency response is acute also for balanced filters employing other resonators than BAW resonators.

There is also a problem related to the ambient temperature of the balanced filters employing BAW resonators. The resonance frequencies of a BAW resonator utilizing ZnO exhibit a temperature coefficient of, typically, −45 ppm/° C. (parts per million). This means that the resonance frequencies of the BAW resonator decrease as the temperature increases. The temperature dependence is at least partly a result of the thermal expansion of the ZnO piezoelectric layer. Consequently, the frequency response of a balanced filter employing BAW resonators is temperature dependent. This may be very inconvenient especially in applications where a large operating temperature range is desirable.

The object of the invention is to present a method for adjusting the center frequency of a balanced filter. A further object is to present an adjusting method that can be applied to dynamic changes of the center frequency. Preferably the method for adjusting the center frequency of balanced filters can be applied when manufacturing balanced filters.

These and other objects of the invention are achieved by adjusting at certain limits the impedance difference between the balanced filter and the surrounding circuitry.

Method according to the invention is a method for adjusting the center frequency of a balanced filter comprising at least four resonators, and the method comprises the steps of:
  specifying a nominal center frequency for the balanced filter when the balanced filter is connected to a circuitry having a certain nominal impedance,
  determining the actual center frequency of the balanced filter when the balanced filter is connected to a circuitry having a certain actual impedance,
  comparing the actual center frequency of the balanced filter to the nominal center frequency of the balanced filter, and
  adjusting the ratio between the impedance of the circuitry and the impedance of the balanced filter within certain limits based on the comparison.

The invention relates also to a plurality of balanced filters on a certain substrate, said plurality comprising balanced filters,
  each of which balanced filters has a certain number, which is at least four, of resonators connected to each other in a certain way, and which plurality of balanced filters is characterized in that
  each of which balanced filters comprises at least one bulk acoustic wave resonator,
  the total area of bulk acoustic wave resonators of a balanced resonator belonging to said plurality is arranged to depend on the position of the balanced filter on the substrate and
  all balanced filters belonging to said plurality have substantially the same actual center frequency.

The accompanying dependent claims describe further preferred embodiments of the invention.

In a method according to the invention the center frequency of a balanced filter is changed by adjusting the ratio of the impedance of the surrounding circuitry and the impedance of the balanced filter. The frequency response of the balanced filter is designed usually so that the frequency response is centered at a certain nominal center frequency when the impedance of the balanced filter and the impedance of the surrounding circuitry have a same, predetermined value. When a slight change to the impedance ratio is caused, the center frequency shifts towards higher (when impedance ratio increases) or lower frequencies (when impedance ratio decreases) from the nominal center frequency. The shape of the frequency response stays practically unchanged.

In a method according to the invention the impedance ratio can be modified by changing the impedance of the balanced filter, the impedance of the surrounding circuitry or both impedances. If the ratio of the impedance of the surrounding circuitry and the impedance of the balanced filter is too large or too small, then the frequency response of the filter does not retain its shape. Therefore the impedance ratio can be adjusted within certain limits only.

One advantage of the invention is that it is possible to compensate dynamic changes, for example due to temperature variations, in the center frequency of a balanced filter by adjusting, for example, the termination impedance in the input and/or output ports of the balanced filter.

A further advantages of the invention is that it is possible to compensate changes in the center frequency of a balanced filter, when the changes are static and due to, for example, structural imperfections of the resonators in the balanced filter. In this case it is advantageous to modify the impedance of the balanced filter, for example the impedance of a specific resonator in the balanced filter. If the balanced filter comprises bulk acoustic wave resonators, their impedance can be adjusted by modifying the area of the resonator. If the balanced filter comprises surface acoustic wave resonators, their impedance can be adjusted by modifying the number of fingers and/or the area of the fingers. In the case of balanced filters employing BAW resonators, the modifications can be made so that, for example, a deposition pattern is partly redrawn. After the pattern has been designed and produced, the yield of balanced filters increases without adding extra step to the manufacturing process. The method according to the invention can be applied to the manufacture of balanced filters employing any kind of BAW resonators discussed in the context of prior art.

The center frequency of any balanced filter based on resonator elements and having a lattice topology shown in FIG. 7a may be tuned according to the invention by modifying the impedance of the surrounding circuitry. The compensation of unidealities in manufacturing by modifying the impedance of the resonators is probably most efficient for balanced filters employing BAW resonators. There the area of the resonators can be easily adjusted. It is also possible to modify the impedance of the filter by adding extra capacitors to the structure of a balanced filter, although this may degrade the frequency response in addition to tuning the center frequency. Adding extra coils to a balanced resonator also modifies the impedance of the filter by changing the inductance of the filter, but here the problem may be, in addition to the degradation of the frequency response, the size of the coils.

Figure 1:
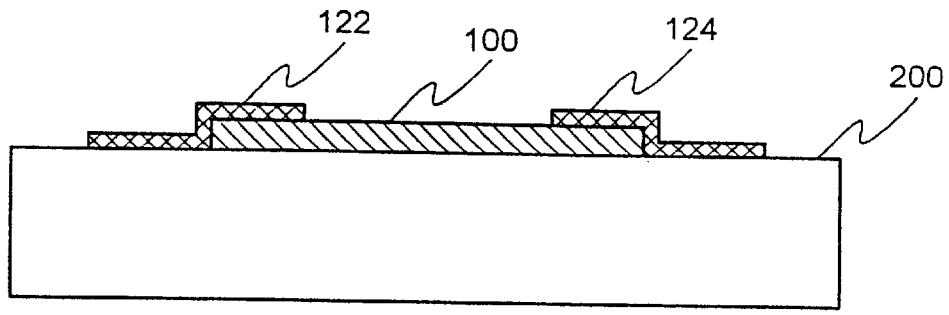
Figure 8:
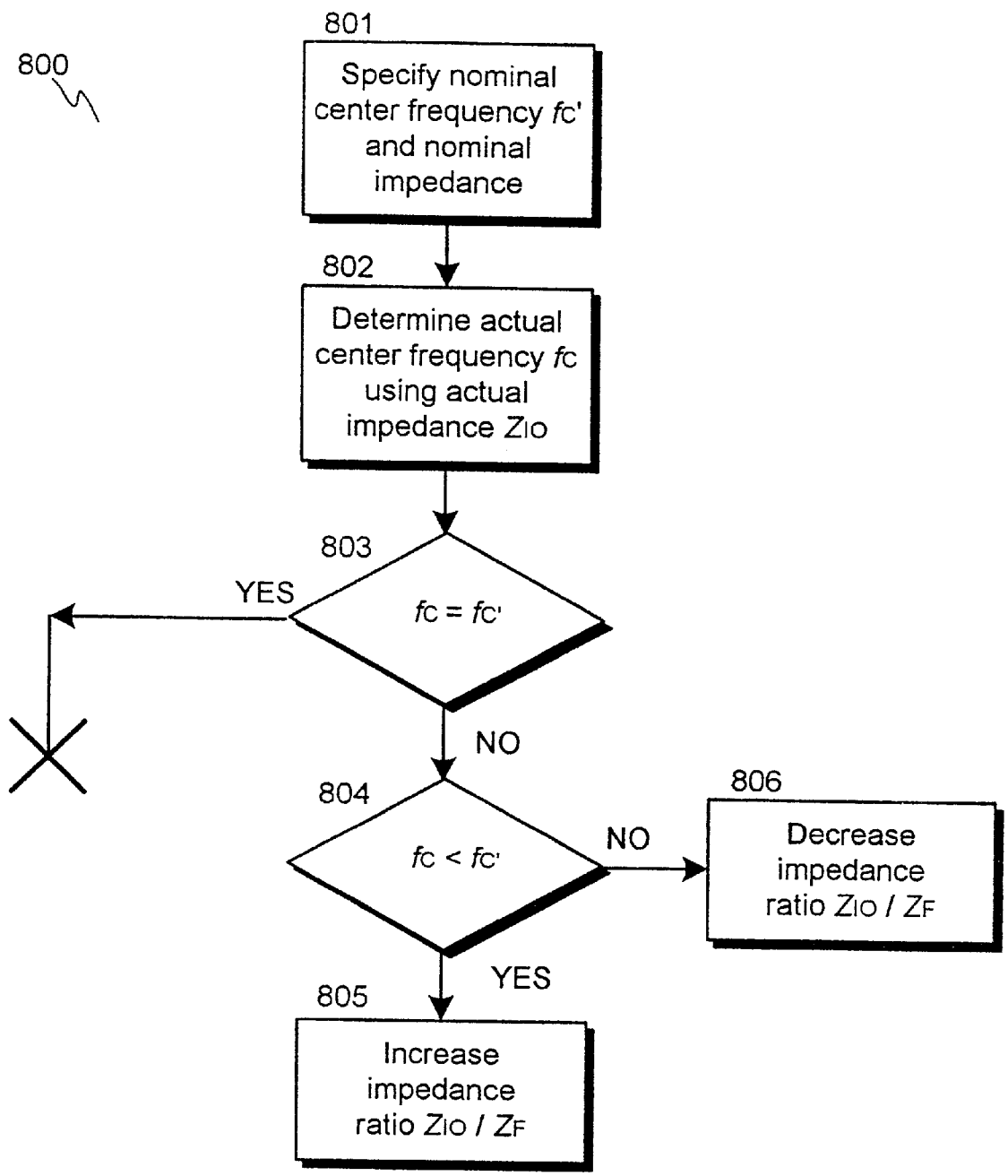
Figure 9:
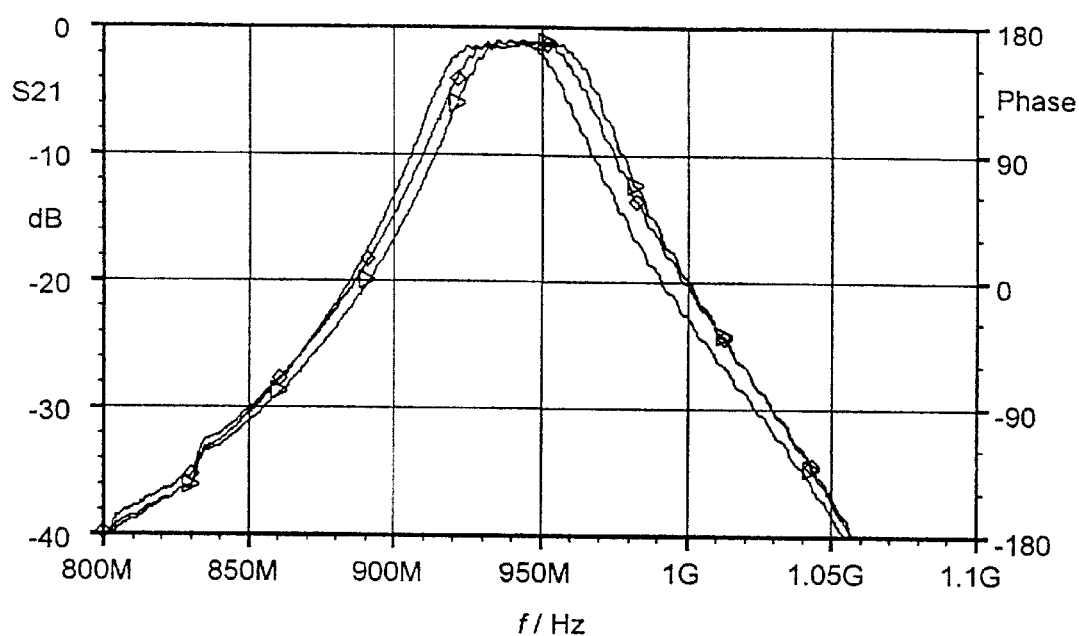
Figure 10:
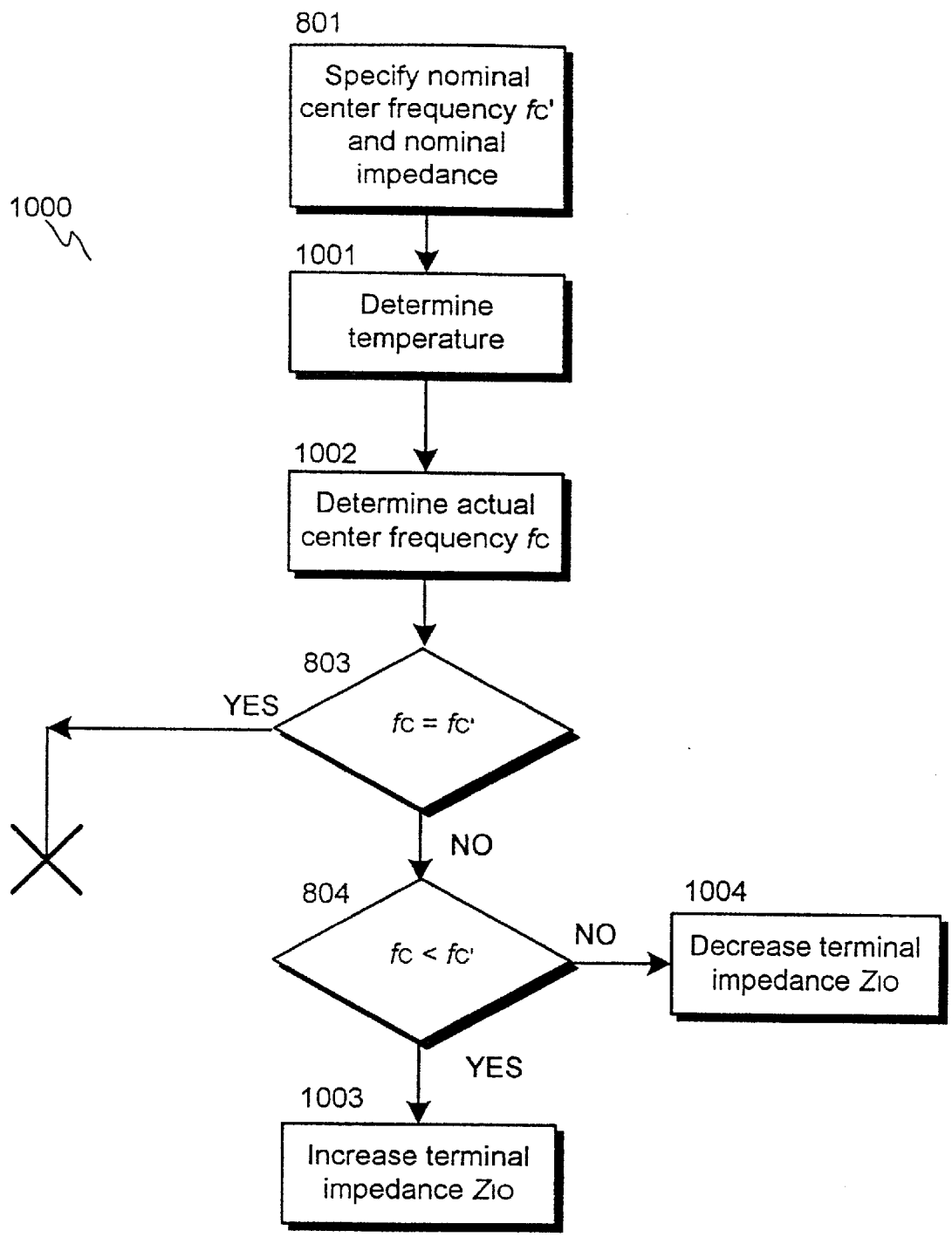
Figure 11:
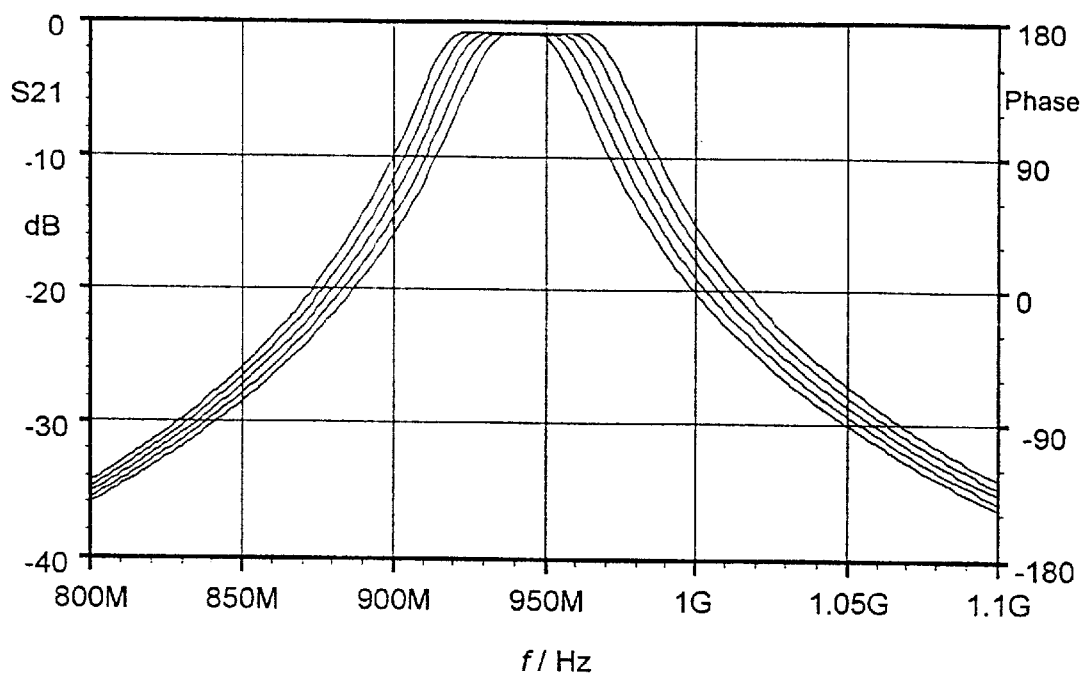
Figure 12:
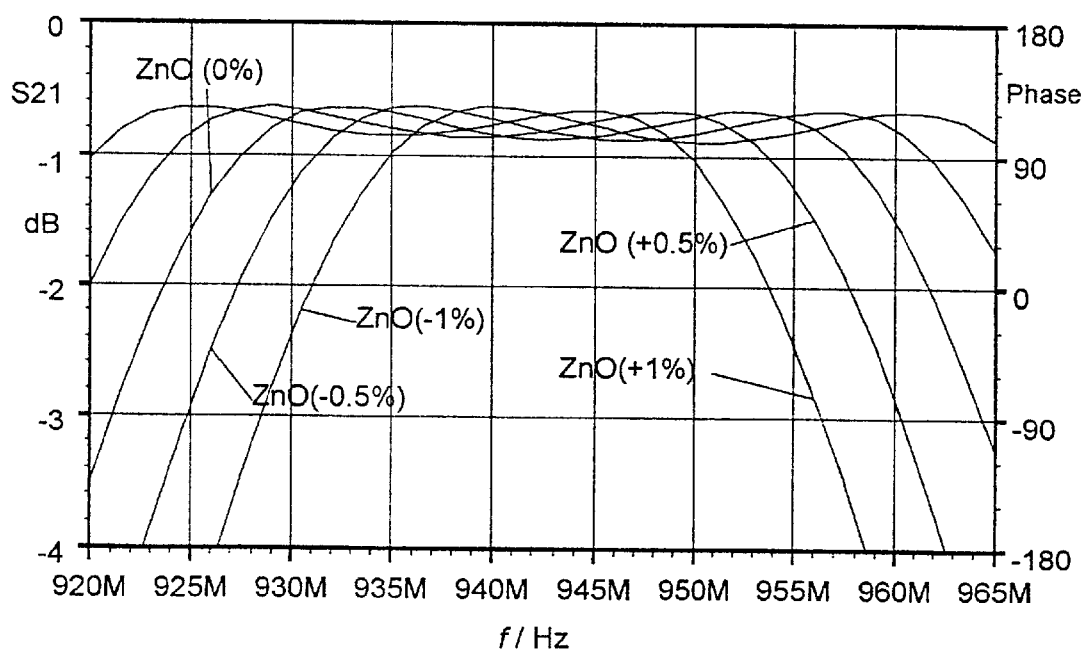
Figure 13:
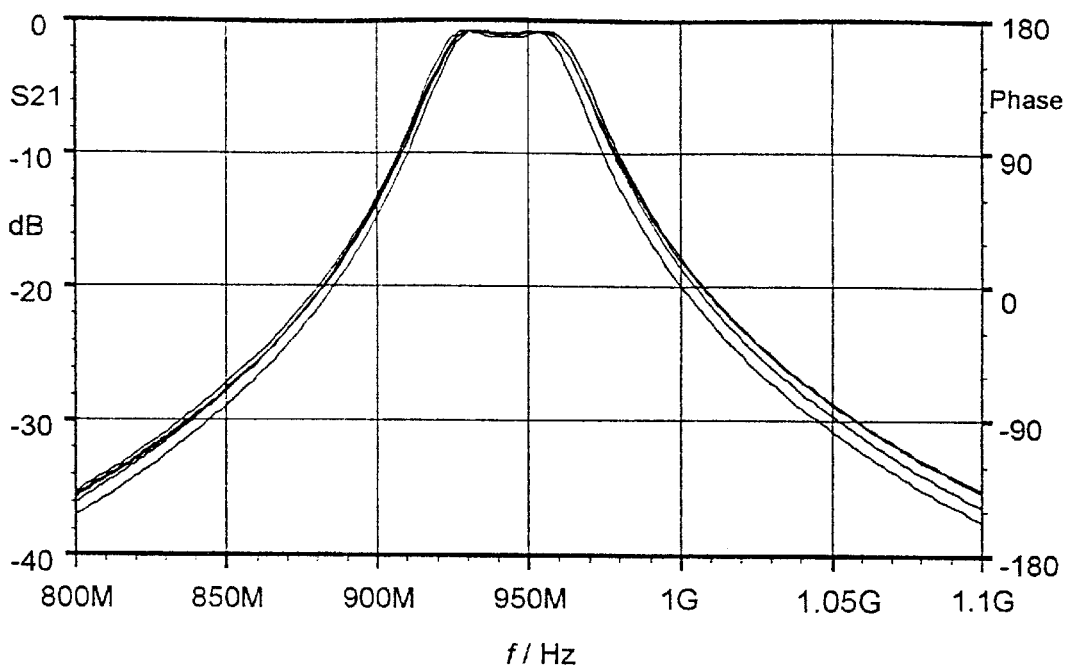
Figure 14:
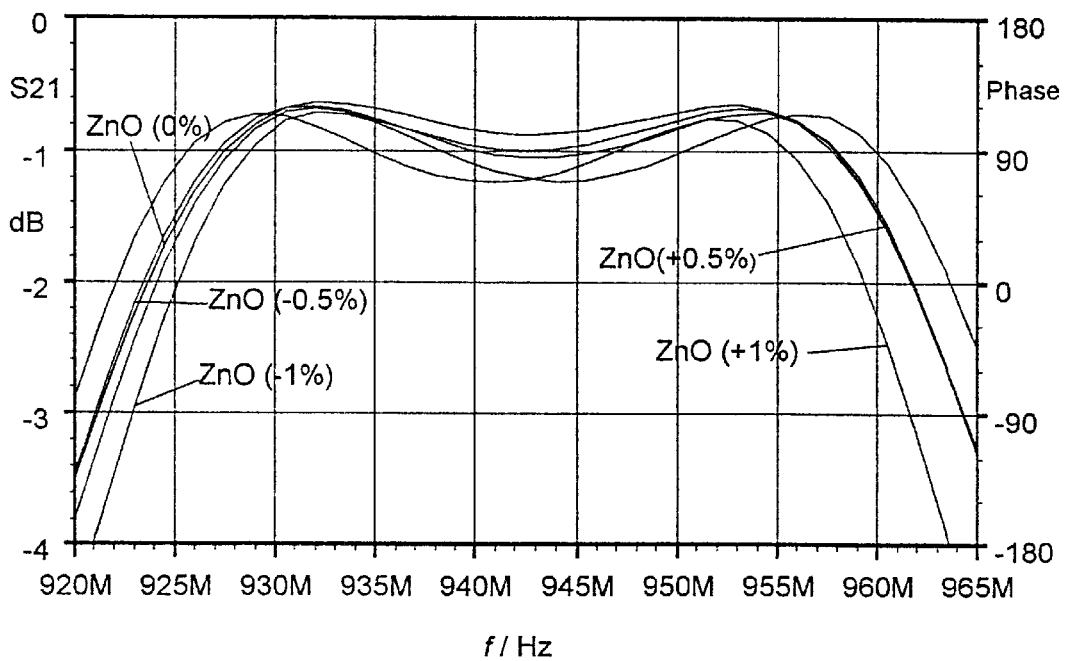
Figure 15:
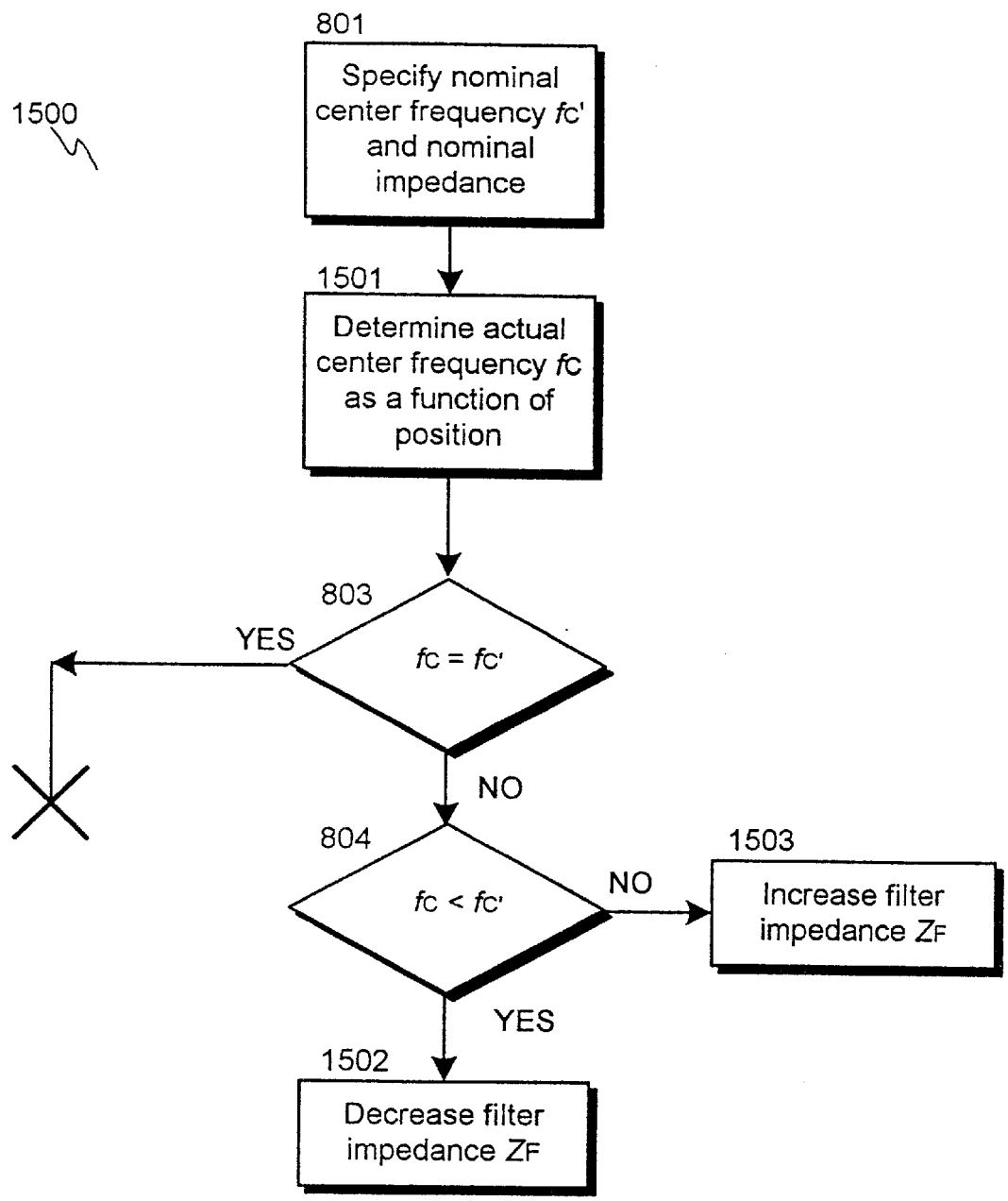
Figure 16:
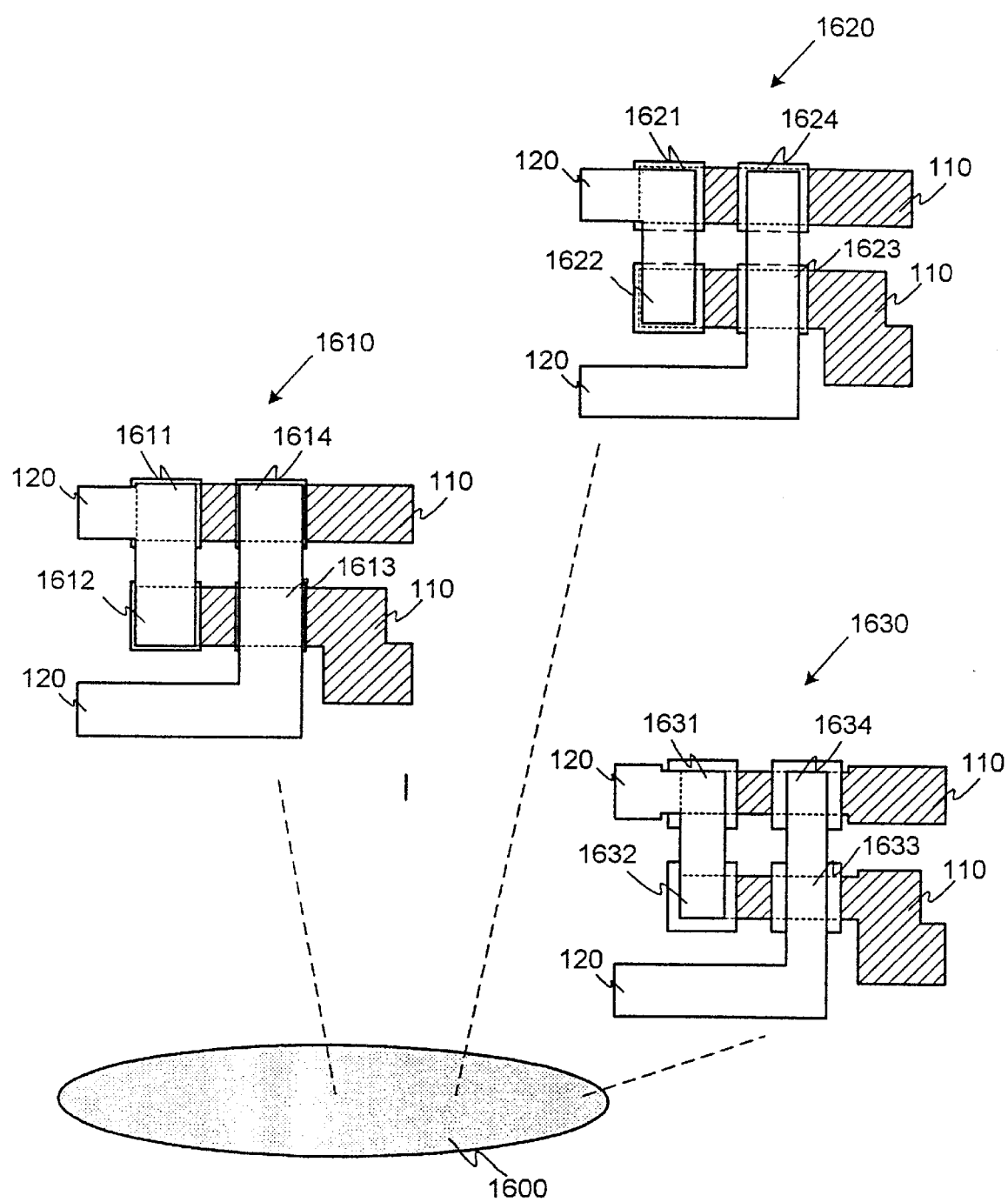

The invention will now be described more in detail with reference to the preferred embodiments by the way of example and to the accompanying drawings where
  FIG. 1 illustrates a surface acoustic resonator according to prior art, FIG. 2 illustrates a bulk acoustic wave resonator according to prior art, FIG. 3 shows another bulk acoustic wave resonator structure having a bridge structure, FIG. 4 illustrates a bulk acoustic wave resonator having a via-hole structure, FIG. 5 illustrates a bulk acoustic wave resonator isolated from the substrate by an acoustic mirror structure, FIG. 6 illustrates a stacked bulk acoustic wave resonator, FIGS. 7a and 7b illustrate a balanced filter and structure of a balanced filter, FIG. 8 illustrates a flowchart of a method for tuning the center frequency of a balanced filter according to a first preferred embodiment of the invention, FIG. 9 shows the effect of changing terminal impedance to the frequency response of a balanced filter, FIG. 10 illustrates of flowchart of a method for compensating the effect of temperature on the center frequency according to a second embodiment of the invention, FIG. 11 shows the effect of variations in piezoelectric layer thickness to the frequency response of balanced filters employing BAW resonators, FIG. 12 shows an enlarged portion of the frequency responses presented in FIG. 11, FIG. 13 shows the effect of compensating the variations in piezoelectric layer thickness by changing impedance of resonators to the frequency response of balanced filters employing BAW resonators, FIG. 14 shows an enlarged portion of the frequency responses presented in FIG. 13, FIG. 15 illustrates a flowchart of a method for tuning the center frequency of balanced filters when manufacturing the filters, and FIG. 16 illustrates a plurality of balanced filters according to the invention.

Above in conjunction with the description of the prior art reference was made to FIGS. 1–7. The same reference numerals are used for corresponding parts in the figures.

FIG. 8 presents a flowchart of a method 800 according to the first preferred embodiment of the invention. In this method, the nominal center frequency $f_c'$ of a balanced filter is determined or specified in step 801. This is a typical step, for example, in the design process of a balanced filter. The nominal impedance for the balanced filter is usually specified together with the nominal center frequency. The nominal impedance for the balanced filter is usually the same as the nominal impedance of the surrounding circuitry.

In step 802 the actual center frequency of a balanced filter $f_c$ is determined, for example, when the balanced filter having a certain actual impedance $Z_F$ is connected to a surrounding circuit having a certain actual impedance $Z_{IO}$. It is possible that not the actual impedance of the surrounding circuitry $Z_{IO}$ nor the actual impedance of the balanced filter $Z_F$ is exactly equal to the nominal impedance. If the method 800 is used in the design phase of a balanced filter, the determination of the actual center frequency of a balanced filter in step 802 may be done by simulation. It may also be based on measurements of the frequency response of a balanced filter physically connected to a certain surrounding circuitry.

In step 803 it is checked if the actual center frequency $f_c$ differs from the nominal center frequency $f_c'$. There may be margin, which may depend on the application, around the nominal center frequency within which the actual center frequency of the balanced filter should fall. The actual center frequency may differ from the nominal value, for example, due to temperature variations or due to changes in the actual structure of the balanced filter compared to the designed structure.

If it is found out that the actual central frequency $f_c$ of the filter is not acceptable, it is studied whether it is too large or too small in step 804. If the actual center frequency is too small, the ratio of the impedance of the surrounding circuitry $Z_{IO}$ and the impedance of the balanced filter $Z_F$ is increased in step 805. The actual center frequency of a balanced filter depends on this ratio $Z_{IO}/Z_F$. If the actual center frequency of the balanced filter is too large, then the ratio $Z_{IO}/Z_F$ is decreased in step 806. The ratio $Z_{IO}/Z_F$ can be modified by adjusting the impedance of the surrounding circuitry, by adjusting the impedance of the balanced filter or by adjusting both impedances.

In method 800 the increase or decrease of ratio $Z_{IO}/Z_F$ in steps 805 and 806 may then be based on the previously measured results. It is also possible to change the ratio $Z_{IO}/Z_F$ iteratively so that after each change in either step 805 or 805, the step 802 is carried out. This is relatively easy when the effect of the ratio $Z_{IO}/Z_F$ to the center frequency of a balanced filter is studied by simulations.

FIG. 9 shows the effect of changing the ratio $Z_{IO}/Z_F$ by changing the value of the impedance $Z_{IO}$ of the surrounding circuitry. FIG. 9 presents the frequency response of a filter in a typical way: the attenuation (S21) of the signal is presented as a function of the frequency. The studied balanced filter employs four BAW resonators, where the piezoelectric layer is made of ZnO and the area of each BAW resonator is 108000 $\mu m^2$. The filter is designed to be operated with nominal impedance of 50 Ω, i.e. the impedance of the balanced filter is designed to be 50 Ω and the impedance of the surrounding circuitry is designed to be 50 Ω (i.e. 50 Ω termination impedance). When the frequency response of the filter is measured using a 50 Ω termination impedance, the center frequency is about 943 MHz. The frequency response measured at 50 Ω is marked in FIG. 9 using a solid line and triangles. It is the rightmost frequency response curve in FIG. 9.

The two other curves in FIG. 9 correspond to two smaller $Z_{IO}$ values: 20 Ω and 35 Ω. For $Z_{IO}$=35 Ω, the measured center frequency is about 938 MHz (solid line and diamonds in FIG. 9) and for $Z_{IO}$=20 Ω the measured center frequency is about 933 MHz (plain solid line in FIG. 9). As can be seen in FIG. 9, the decrease of the termination impedance $Z_{IO}$ decreases the center frequency but substantially retains the original shape of the frequency response of the studied balanced filter. The value of attenuation at the passband is substantially the same for all termination impedances 20, 35 and 50 Ω. The center frequency of a balanced filter having a center frequency about 945 MHz can thus be decreased about 10 MHz without substantially changing the shape of the frequency response by adjusting the termination impedance $Z_{IO}$.

In the measurements whose results are presented in FIG. 9, the termination impedance of both an input port and an output port of the balanced filter was changed. If a balanced filter is succeeded, for example, by a buffer stage, then it may be possible to change the input impedance of the buffer in order to, for example, compensate temperature effects. The shift in the center frequency is larger if both port impedances of the filter are changed, but changing just one port impedance also causes a shift.

In some cases a balanced filter is driven single-ended from one side, i.e. one of the input and output ports is grounded. The change of the termination impedance of the coupled port affects the center frequency also in this case if the node between the loads at the balanced side is not grounded.

The effect presented in FIG. 9 can be observed with balanced filters having the structure specified in FIG. 7a. It is not a feature which is restricted to balanced filters employing BAW resonators. Therefore slight tuning of the center frequency can be performed on any balanced filter having the structure specified in FIG. 7a.

FIG. 10 shows a method 1000 for compensating temperature effects of a balanced filter according to a second preferred embodiment of the invention. Similarly as in the previous method 800, in the first step 801 the nominal center frequency $f_c'$ of a balanced filter and the nominal impedance of the balanced filter (and that of the surrounding circuitry) are specified.

Here it is assumed that the center frequency of the balanced filter is a function of temperature as is the case, for example, for balanced filters employing BAW resonators using ZnO piezoelectric layer. In step 1001 the ambient temperature or, for example, directly the temperature of the balanced filter (or the circuitry board where the filter is attached to) is measured. In step 1002 the actual center frequency $f_c$ of the balanced filter is determined in the measured temperature. The temperature dependence of the center frequency of the balanced filter may be, for example, measured in advance, before a system employing the balanced filter is taken into operation. In this case, there may be, for example, a table of temperatures and for each temperature, an entry corresponding to the previously measured center frequency of the balanced filter. In steps 1001 and 1002 the temperature may thus be measured and the corresponding actual center frequency may be looked up in the table. In steps 803 and 804 of the method 1000 the actual center frequency $f_c$ is compared to the nominal center frequency $f_c'$, and if the impedance ratio $Z_{IO}/Z_F$ needs to be adjusted, it may be done in steps 1003 and 1004 by changing the impedance $Z_{IO}$ of the surrounding circuitry.

The shift of 10 MHz in the center frequency corresponds to a temperature change of 200° C. with the temperature coefficient −45 ppm/° C. It may not, however, be practical to compensate such a vast temperature change. Increase in temperature, for example, may increase the insertion loss of the balanced filter, thus degrading its performance.

FIG. 11 shows simulated frequency responses of various balanced filters. In the simulation it is assumed that the balanced filter comprises four BAW resonators. The balanced filters may be, for example, such as presented in FIG. 7b. In BAW resonators the resonance frequencies depend mainly on the thickness of the layers in the resonator and on the acoustic velocities in the layer materials.

The difference in the balanced filters studied in FIGS. 11 and 12 is that the piezoelectric layer thickness in the four BAW resonators belonging to the filter structure is changed. A change in electrode thickness causes a similar effect, but here it is assumed that the electrode layers have a certain common thickness for all five balanced filters. Table 1 presents the thickness of the piezoelectric layer for each of the five balanced filters. The area of each BAW resonator is 103 300 $\mu m^2$ in FIG. 11 and 12.

The five frequency response curves in FIG. 11 have substantially the same shape. The frequency response curve in the middle in FIG. 11 corresponds to a balanced filter having the piezoelectric layer thickness of 2680 nm in the BAW resonators. The two left-most frequency response curves correspond to balanced filters where the piezoelectric layer is 1% (leftmost curve) and 0.5% thicker than in the balanced filter corresponding to the middle curve. The two right-most frequency response curves correspond to balanced filters having the piezoelectric layer 0.5% and 1% (rightmost curve) thinner than in the balanced filter corresponding to the middle curve.

FIG. 12 shows an enlarged view of the same frequency response curves. As can be seen from FIG. 12, the 0.5% change in the piezoelectric layer thickness of BAW resonators belonging, for example, to a such balanced filter as specified in FIG. 7b causes about 4 MHz shift to the center frequency of about 943 MHz. In FIG. 12, the shape of the frequency response curves is very uniform.

FIG. 13 shows the simulated frequency response curves of other five balanced filters. These five balanced filters are slightly modified compared to those balanced filters studied above. The difference is that the impedances $Z_F$ of the four balanced filters which have too thick or thin piezoelectric layer have been modified. The ratio $Z_{IO}/Z_F$ has thus been modified to compensate for the thickness variations in the piezoelectric layer. In the simulation, the impedance $Z_{IO}$ is 50 Ω. The areas of the BAW resonators and corresponding the impedance of the resonators are presented in Table 1.

TABLE 1

| Details for FIGS. 11, 12, 13 and 14 | | Details for FIGS. 13 and 14 | |
|---|---|---|---|
| symbol of the balanced filter | piezoelectric layer thickness (nm) | area of each BAW resonator ($\mu m^2$) | impedance (Ω) |
| ZnO(−1%) | 2653 | 172000 | 30 |
| ZnO(−0.5%) | 2666 | 139500 | 37 |
| ZnO(0%) | 2680 | 103300 | 50 |
| ZnO(+0.5%) | 2693 | 73800 | 70 |
| ZnO(+1%) | 2707 | 60700 | 85 |

As can be seen in FIG. 13, the five frequency response curves are substantially overlapping. FIG. 14 presents more details of behavior of the frequency responses within the passband region. The center frequencies of the five balanced filters, when the thickness variation of the piezoelectric layer has been compensated by changing the ratio $Z_{IO}/Z_F$, are within 5 MHz. This is a clear enhancement when compared to the center frequencies in FIG. 12, which are within 16 MHz.

It can be seen from FIG. 14 that the frequency response of the balanced filter whose impedance has not been modified (marked with ZnO(0%) in FIG. 14) is the most flat one. For the balanced filters having piezoelectric layer thicknesses ±0.5% different from the nominal value and having their impedance slightly modified, the frequency response curves in FIG. 13 show a slight dent at the center frequency of 943 MHz. For the balanced filters having piezoelectric layer thicknesses ±1% different from the nominal value and having their impedances modified slightly from the nominal value, there is a somewhat deeper dent at the center frequency. In practice these small variations in the shape of the frequency response most probably do not cause any problems.

The values presented in the two rightmost columns in Table 1 for the five balanced filter structures are results of a coarse optimization. Even better results may be obtained with a more elaborate adjustment of the BAW resonators areas.

Balanced filters employing BAW resonators are usually produced using thin film technology. The various layers are deposited on top of each other, and the piezoelectric layer, which is usually the thickest layer in the BAW resonator structure, is generally sputter deposited. The deposition process is not ideal and therefore small thickness variations may occurs across the wafer.

The thickness variations of the layers, and especially those of the piezoelectric layer, affect the resonance frequencies of the BAW resonators. The resonance frequencies, in turn, affect the frequency response, and specifically the center frequency, of the balanced filters as can be seen, for example, in FIGS. 11 and 12.

It is possible to compensate the shifts in the center frequencies due to piezoelectric layer thickness variations by, for example, adjusting the terminal impedances in the circuitry to which the filters are connected. It is also possible to adjust the impedance of the filters, for example by adding suitable capacitors or coils to the filter structure. The problem with adding extra capacitors or coils is that they usually cause more attenuation at the passband.

It is also possible to change the ratio $Z_{IO}/Z_F$ by changing the impedance $Z_F$ of the balanced filter. This is very advantageous when compensating variations due to manufacturing, for example due to non-uniform piezoelectric layer thickness in BAW resonators or to non-uniform finger dimensions in SAW resonators.

FIG. 15 presents a flowchart of a method 1500 according to a third preferred embodiment of the invention. Using this method it is possible to compensate variations in the center frequency of balanced filters already when designing the filters.

Method 1500 begins with the design step 801, where the nominal center frequency and nominal impedance of the balanced filter are specified. Thereafter the actual center frequency $f_c$ of the balanced filters as a function of position on a wafer, for example, is determined in step 1501. If the balanced filters employ BAW resonators, then the thickness variations of the piezoelectric layer (when the aim was to produce a uniformly thick piezoelectric layer) may be studied using, for example, wafers where a piezoelectric layer has been deposited using the same equipment as is to be used in the manufacturing of the new balanced filters. The thickness of the piezoelectric layer may be studied, for example, directly by investigating the thickness of a deposited piezoelectric layer or, for example, by measuring the center frequencies of balanced filters processed in a conventional way on a wafer.

Thereafter in step 803 the actual center frequency of a balanced filter, which is a function of the position on a wafer, is compared to the nominal center frequency. In some parts of a wafer the piezoelectric layer thickness and the resulting actual center frequency may be correct without any adjustment of the filter impedance $Z_F$. If the center frequency is smaller or larger than the nominal center frequency, it is advantageous to modify the filter impedance (steps 1502, 1503) so that the ratio $Z_{IO}/Z_F$ is modified. The change in ratio $Z_{IO}/Z_F$ results in a change in the center frequency of a balanced filter. Decreasing the impedance $Z_F$ of the balanced filter while keeping the impedance of the surrounding circuitry constant causes the actual center frequency to increase. Similarly, increasing the impedance $Z_F$ of the balanced filter causes the actual center frequency to decrease.

The impedance of a balanced filter depends on the impedance of the resonators belonging to the balanced filter. The impedance $Z_F$ of the balanced filter can be thus changed by changing the impedance of the resonators. In case of BAW resonators, the impedance of a resonator mainly depends on the thickness of the piezoelectric layer and on the area of the resonator. The thickness of the resonator is something that the sputter deposition, for example, produces, but the area of the resonator can be easily controlled by varying the area where the top and bottom electrodes overlap. By varying the area of the resonator the impedance of a BAW resonator can be changed without affecting the resonance frequencies of the BAW resonator.

To decrease the impedance of a BAW resonator, i.e. to compensate too thick a piezoelectric layer causing too small a center frequency for a balanced filter, the area of the resonator is increased. Similarly, if the thickness of the piezoelectric layer is too small, this can be compensated by decreasing the area of the resonator. The area of a resonator is easy to control by designing properly the pattern masks which are used in producing the top and bottom electrodes of a BAW resonator. Typically there is a nominal value for the BAW resonator area which corresponds to the nominal thickness of the piezoelectric layer. If both the thickness of the piezoelectric layer and the area of the BAW resonator have the nominal values, the actual center frequency of the balanced filter employing BAW filters is the nominal center frequency.

The areas where the piezoelectric layer is thicker or thinner than the nominal value due to, for example, the properties of the sputter deposition equipment can vary from equipment to equipment. The piezoelectric layer may be, for example, thickest at the center of the wafer or there may be a circle where the layer is thickest. The variations in the thickness of the piezoelectric layer are usually the same for piezoelectric layers produced with certain equipment when the sputter deposition conditions are not altered. By studying the piezoelectric layers deposited on a wafer or other substrate using certain equipment, the variations in the piezoelectric layer thickness can be found out and then compensated by using the method 1500 according to the invention in the design of new balanced filters.

The BAW resonators in the balanced filters may have different areas. For example, the resonators marked with A in FIG. 7a may have a certain area, and the resonators marked with B another area. The ratio of the areas of resonators A and resonators B may be, for example, 1.2. The frequency response of such a balanced filter has a very steep attenuation slope outside the passband. It is also possible that all four BAW resonators of a balanced filter have different areas. This may be the case, for example, when the substrate on which the balanced filters are produced is not electrically insulating.

The ratio of the areas of BAW resonators of a certain balanced filter affect the frequency response of the balanced filter. Therefore it is advantageous that the ratio of the areas is sustained when the areas are changed in order to adjust the impedance of the balanced filter. In other words, in steps 1502, 1503 of the method 1500 it is advantageous in the design phase to multiply the areas of the BAW resonators of a certain balanced filter with a certain constant that depends on the location of the balanced filter on a substrate. Proper values for the BAW resonator areas can be found, for example, by simulations after the thickness variations of the piezoelectric layer or the variations in the center frequency of the balanced filters have been estimated.

Typically a large amount of balanced filters is produced on a substrate plate. In FIG. 16 such a substrate plate 1600 is presented schematically. It is possible that each balanced filter forms a part of larger circuitries deposited on the same substrate. Once the circuitries or balanced filters are manufactured on the substrate, the substrate is sawn to suitable pieces where each piece comprises typically one balanced filter or one circuitry comprising the balanced filter.

On the substrate 1600 there are balanced filters 1610, 1620, 1630 whose impedances are adjusted according to the invention. In the design phase a balanced filter having a certain number of resonators having certain resonator frequencies, is specified to obtain a desired frequency response. For balanced filters 1610, 1620, 1630 presented in FIG. 16 as an example the structure specified is that the four BAW resonators have equal areas.

The balanced filter 1620, whose distance from the center of the wafer is about half the radius of the wafer, comprises four BAW resonators (1621, 1622, 1623, 1624) each having a certain area. The balanced filter 1610, located at the center of the wafer, comprises similarly four BAW resonators (1611, 1612, 1613, 1614) having equal areas, but the areas are larger than those of the BAW resonators in the balanced filter 1620. The decreased impedance of the balanced filter compensates (at least partly) the too low center frequency caused by the too thick piezoelectric layer. Further, the balanced filter 1630 located near the edge of the wafer has four BAW resonators having equal areas, but the areas are smaller than those of the resonators in the balanced filters 1620 and 1610. Here the increased impedance of the balanced filter compensates the too high center frequency of the balanced filter caused by the too thin piezoelectric layer.

It is also possible that in a balanced filter not all or any resonators are bulk acoustic wave resonators. In a plurality of such balanced filters, the impedance of at least one resonator of the balanced filters may be varied. If the balanced filters comprise a bulk acoustic resonator, its area may be varied in a suitable manner. Further, if the balanced filters comprise more than one bulk acoustic wave resonator, the total area of bulk acoustic wave resonators belonging to the balanced resonators may depend, for example, on the position of the balanced filter on the substrate. In these cases, where the impedance ratios between the resonators belonging to a balanced filter vary from one balanced filter to another, the shape of the frequency response may also vary from one balanced filter to another.

In view of the foregoing description it will be evident to a person skilled in the art that various modifications may be made within the scope of the invention. While a preferred embodiment of the invention has been described in detail, it should be apparent that many modifications and variations thereto are possible, all of which fall within the true spirit and scope of the invention.

What is claimed is:

1. Method for adjusting the center frequency of a balanced filter comprising at least four resonators, comprising the steps of:
    specifying a nominal center frequency for the balanced filter when the balanced filter is connected to a circuitry having a certain nominal impedance,
    determining the actual center frequency of the balanced filter when the balanced filter is connected to a circuitry having a certain actual impedance,
    comparing the actual center frequency of the balanced filter to the nominal center frequency of the balanced filter, and
    adjusting the ratio between the impedance of the circuitry and the impedance of the balanced filter within certain limits based on the comparison.

2. Method for adjusting the center frequency of a balanced filter according to claim 1, wherein the impedance of the balanced filter is adjusted.

3. Method for adjusting the center frequency of a balanced filter according to claim 2, wherein the impedance of at least one the resonators of the balanced filter is adjusted.

4. Method for adjusting the center frequency of a balanced filter according to claim 3, wherein the balanced filter comprises at least one bulk acoustic wave resonator, said method comprising further the steps of:
    determining the actual center frequency of a balanced filter having said bulk acoustic wave resonator having a certain nominal area, and
    adjusting the area of said bulk acoustic wave resonator based on the actual center frequency.

5. Method for adjusting the center frequency of a balanced filter according to claim 4, wherein the actual center frequency is determined by determining the thickness of the piezoelectric layer of said bulk acoustic resonator.

6. Method for adjusting the center frequency of a balanced filter according to claim 4, comprising further the steps of:
    depositing on a certain substrate a plurality of balanced filters, each of which balanced filters has a certain number, which is at least four, of resonators connected to each other in a certain way, at least one of said at least four resonators being a bulk acoustic wave resonator, and
    processing the layer structure of said bulk acoustic wave resonator in each balanced filter belonging to said plurality using certain steps, which are common for all balanced filters belonging to said plurality,
    and wherein the area of said bulk acoustic wave resonator belonging to a certain balanced filter belonging to said plurality is adjusted based on the position of the balanced filter on the substrate.

7. Method for adjusting the center frequency of a balanced filter according to claim 6, wherein the plurality of balanced filters is deposited on a certain disc-like substrate.

8. Method for adjusting the center frequency of a balanced filter according to claim 2, comprising further the step of:
    adding at least one capacitor to the balanced filter.

9. Method for adjusting the center frequency of a balanced filter according to claim 8, wherein said capacitor is adjustable.

10. Method for adjusting the center frequency of a balanced filter according to claim 2, comprising further the step of:
    adding at least one coil to the balanced filter.

11. Method for adjusting the center frequency of a balanced filter according to claim 1, wherein
    the balanced filter is connected to a circuitry using an input port and an output port and
    the impedance of at least one of the ports is adjusted.

12. Method for adjusting the center frequency of a balanced filter according to claim 11, wherein the impedance of the input port and the impedance of the output port is adjusted.

13. Method for adjusting the center frequency of a balanced filter according to claim 1, comprising further the step of determining operating temperature for the balanced filter and wherein
    the actual center frequency of the balanced filter is determined in said temperature, and
    the actual center frequency of the balanced filter in said temperature is compared to the nominal center frequency of the balanced filter.

14. A plurality of balanced filters on a certain substrate, said plurality comprising balanced filters,
    each of which balanced filters having a certain number, which is at least four, of resonators connected to each other in a certain way,
    each of which balanced filters comprising at least one bulk acoustic wave resonator,
    the total area of bulk acoustic wave resonators of a balanced filter belonging to said plurality being arranged to depend on the position of the balanced filter on the substrate, and
    all balanced filters belonging to said plurality having substantially the same actual center frequency.

15. A plurality of balanced filters according to claim 14, wherein each balanced filter comprises a first bulk acoustic wave resonator having a first area and connecting a first signal line to a third signal line, a second bulk acoustic wave resonator having a second area and connecting a second signal line to a fourth signal line, a third bulk acoustic wave resonator having a third area and connecting the first signal line to the fourth signal line and a fourth bulk acoustic wave resonator having a fourth area and connecting the second signal line to the third signal line, and said first area, second area, third area and fourth area are arranged to depend on the position of said balanced filter on the substrate.

16. A plurality of balanced filters according to claim 15, wherein in each balanced filter belonging to said plurality, the ratio of the first area, second area, third area and fourth area is substantially the same.

17. A plurality of balanced filters according to claim 16, wherein said substrate is substantially a disc-like plate.

* * * * *